(12) United States Patent
Liu

(10) Patent No.: US 8,354,598 B2
(45) Date of Patent: Jan. 15, 2013

(54) PACKAGING SUBSTRATE AND FABRICATION METHOD THEREOF

(75) Inventor: Chin-Ming Liu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 443 days.

(21) Appl. No.: 12/731,480

(22) Filed: Mar. 25, 2010

(65) Prior Publication Data

US 2010/0319966 A1 Dec. 23, 2010

(30) Foreign Application Priority Data

Jun. 23, 2009 (TW) ................................ 98120959 A

(51) Int. Cl.
*H05K 1/03* (2006.01)
(52) U.S. Cl. ........................................ 174/255; 174/261
(58) Field of Classification Search .................. 174/250, 174/255, 257, 261, 262–265; 361/719, 720, 361/761, 767; 257/678, 690–692, 700, 701, 257/703, 704, 713, 723, 724, 428–434, 459, 257/460, 470
See application file for complete search history.

(56) References Cited

U.S. PATENT DOCUMENTS

| | | | | |
|---|---|---|---|---|
| 2006/0273816 A1* | 12/2006 | Hsu | ............................... | 324/765 |
| 2008/0251283 A1* | 10/2008 | Araki | ............................ | 174/255 |
| 2009/0159316 A1* | 6/2009 | Kuramochi | .................... | 174/255 |
| 2009/0294156 A1* | 12/2009 | Ueno et al. | ..................... | 174/255 |
| 2009/0308640 A1* | 12/2009 | Jeung et al. | .................... | 174/255 |

FOREIGN PATENT DOCUMENTS

TW I365026 12/2010

* cited by examiner

*Primary Examiner* — Yuriy Semenenko
(74) *Attorney, Agent, or Firm* — Edwards Wildman Palmer LLP; Peter F. Corless; Steven M. Jensen

(57) ABSTRACT

A method for fabricating a packaging substrate includes: stacking two metal layers; encapsulating the two metal layers with assistant dielectric layers; forming built-up structures on the assistant dielectric layers, respectively; and separating the built-up structures along the interface between the two metal layers so as to form two packaging substrates. Owing to the adhesive characteristic of the assistant dielectric layers, the two metal layers are unlikely to separate from each other during formation of the built-up structures. But after portions of the dielectric layer around the periphery of the metal layers are cut and removed, the two metal layers can be readily separated from each other. The two metal layers can be patterned to form wiring layers, metal bumps, or supporting structures to avoid waste of materials. A packaging substrate and a fabrication method thereof are provided.

4 Claims, 14 Drawing Sheets

US 8,354,598 B2

PACKAGING SUBSTRATE AND FABRICATION METHOD THEREOF

CROSS-REFERENCES TO RELATED APPLICATIONS

This application claims under 35 U.S.C. §119(a) the benefit of Taiwanese Application No. 098120959 filed Jun. 23, 2009 the entire contents of which is incorporated herein by reference.

BACKGROUND OF THE INVENTION

1. Field of the Invention

The present invention relates generally to packaging substrates, fabrication methods thereof and base materials, and more particularly, to a low-cost packaging substrate and a fabrication method thereof.

2. Description of Related Art

Along with the development of electronic industries, electronic products have a trend towards miniaturization and high performance, and accordingly multi-layer boards are developed so as to increase the layout area for the layout through interlayer connection techniques, meet demands for high-density integrated circuits, and reduce the thickness of packaging substrates.

Conventionally, a multi-layer board comprises a core board and built-up structures formed on two sides of the core board. However, the use of the core board increases the length of wires and thickness of the overall structure. Accordingly, coreless boards are developed to shorten the length of wires and reduce the thickness of the overall structure, thereby meeting the developmental trend of high frequency and miniaturization.

FIGS. 1A to 1F shows a conventional packaging substrate and a method for fabricating the same.

Referring to FIG. 1A, a carrier board 10 is provided, and a thin metal layer 11, a releasing layer 12 and a carrier metal layer 13 are formed in sequence on the two surfaces of the carrier board 10.

Referring to FIG. 1B, a first dielectric layer 14 is formed on the carrier metal layer 13.

Referring to FIG. 1C, a plurality of vias 140 are formed in the first dielectric layer 14 through a photolithography process or laser ablation, and portions of the carrier metal layer 13 exposed from the vias 140 are etched away so as to form a plurality of concave portions 130.

Referring to FIG. 1D, a plurality of solder bumps 141a and first conductive vias 141b are formed in sequence in the concave portions 130 and the corresponding vias 140, and a first wiring layer 142 is formed on the first dielectric layer 14 and electrically connected to the first conductive vias 141b. A built-up structure 15 is formed on the first dielectric layer 14, wherein the built-up structure 15 comprises at least a second dielectric layer 151, a second wiring layer 152 formed on the second dielectric layer 151, and a plurality of second conductive vias 153 formed in the second dielectric layer 151 and electrically connecting the first wiring layer 142 and the second wiring layer 152. The second wiring layer 152 disposed on an outermost portion of the built-up structure 15 has a plurality of conductive pads 154. An insulating protective layer 16 is formed on an outermost portion of the built-up structure 15. A plurality of openings 160 corresponding in position to the conductive pads 154, respectively, are formed in the insulating protective layer 16 so as for the conductive pads 154 to be exposed from the insulating protective layer 16.

Referring to FIG. 1E, the releasing layer 12 is separated from the carrier metal layer 13 so as to separate packaging substrates to be formed subsequently from the carrier board 10.

Referring to FIG. 1F, the carrier metal layer 13 is removed such that the solder bumps 141a protrude from the surface of the first dielectric layer 14 to thereby allow a semiconductor chip (not shown) to be mounted thereto.

As described above, the releasing layer 12 made of metal is formed on both sides of the carrier board 10, then the built-up structure 15 is formed on the releasing layer 12 on both sides, and finally the built-up structure 15 at the two sides of the carrier board 10 is separated along the interface between the releasing layer 12 and the carrier metal layer 13 so as to from two packaging substrates.

However, in the above method, the carrier board 10 and the thin metal layer 11 required for temporarily supporting the structure complicate the fabrication process. Also, the temporary carrier (including the carrier board 10, the thin-film metal layer 11 and the releasing layer 12) is finally discarded, which results in a waste of materials and increase of fabrication costs.

Therefore, it is imperative to overcome the above drawbacks of the prior art.

SUMMARY OF THE INVENTION

In view of the above drawbacks of the prior art, the present invention provides a packaging substrate and a fabrication method thereof so as to prevent the conventional drawbacks of material waste and complicated processes caused by discarding of the temporary carrier in the prior art and formation of the releasing layer or adhesive layer on the temporary carrier.

In order to achieve the above and other objectives, the present invention provides a packaging substrate, which comprises: a first assistant dielectric layer having an inner wiring layer disposed on one surface thereof and a plurality of inner conductive vias disposed therein to electrically connect to the inner wiring layer; a plurality of metal bumps disposed on the other surface of the first assistant dielectric layer and electrically connected to the inner conductive vias, wherein the inner wiring layer and a corresponding one of the metal bumps are electrically connected to a wire-connected end and a bump-connected end of each of the inner conductive vias, respectively, and the wire-connected end has a larger diameter than the bump-connected end; a built-up structure disposed on the first assistant dielectric layer and the inner wiring layer, wherein the built-up structure comprises at least a first dielectric layer, a first wiring layer disposed on the first dielectric layer, and a plurality of first conductive vias disposed in the first dielectric layer and electrically connecting the first wiring layer and the inner wiring layer, the first wiring layer disposed on an outermost portion of the built-up structure further has a plurality of first conductive pads; and a first insulating protective layer disposed on the built-up structure and having a plurality of openings corresponding in position to the first conductive pads, respectively, so as for the first conductive pads to be exposed from the first insulating protective layer.

The metal bumps are solder pads serving electrical connections for a flip-chip package. Alternatively, the metal bumps are a heat sink and wire bonding pads surrounding the heat sink serving electrical connections for a wire bonding package. Preferably, the packaging substrate further comprises a metal support frame.

The present invention further provides a method for fabricating a packaging substrate, which comprises the steps of: providing a base material, which comprises two first metal layers, each having a first surface and an opposed second surface, stacked together with the first surfaces thereof facing each other, two first assistant dielectric layers formed on the second surfaces of the first metal layers, respectively, and encapsulating the first metal layers, and two second metal layers formed on the exposed surfaces of the first assistant dielectric layers, respectively; patterning the second metal layers to form inner wiring layers; and forming built-up structures on the first assistant dielectric layers and the inner wiring layers to form an overall structure, wherein the built-up structures each at least comprise a first dielectric layer, a first wiring layer formed on the first dielectric layer, and a plurality of first conductive vias formed in the first dielectric layer and electrically connecting the first wiring layer and the inner wiring layer.

Fabrication of the base material comprises the steps of: providing the two first metal layers each having a first surface and an opposed second surface, and stacking the two first metal layers together with the first surfaces thereof facing each other; stacking the first assistant dielectric layers on the second surfaces of the first metal layers; and stacking the second metal layers on the exposed surfaces of the first assistant dielectric layers, followed by laminating together the first metal layers, the first assistant dielectric layers and the second metal layers such that the two first assistant dielectric layers are bonded together to encapsulate the two first metal layers.

The above-described method for fabricating a packaging substrate further comprises cutting the overall structure along edges passing through the first metal layers so as to separate the first metal layers from each other, thereby forming two initial substrates. According to the above-described method, the first wiring layers disposed on an outermost portion of the built-up structures further have a plurality of first conductive pads, and first insulating protective layers are formed on the built-up structures and formed therein with a plurality of openings corresponding in position to the conductive pads, respectively, so as to expose the conductive pads from the insulating protective layers. The method further comprises patterning the first metal layers so as to form second wiring layers, and forming in the first assistant dielectric layers a plurality of second conductive vias electrically connecting the inner wiring layers and the second wiring layers, wherein the second wiring layers comprise a plurality of second conductive pads, and second insulating protective layers are formed on the first assistant dielectric layers and formed therein with a plurality of openings corresponding in position to the second conductive pads, respectively, so as for the second conductive pads to be exposed from the second insulating protective layers.

According to another embodiment, the first wiring layers disposed on an outermost portion of the built-up structures further have a plurality of first conductive pads, and the method further comprises: forming first insulating protective layers on the built-up structures and forming in the first insulating protective layers a plurality of openings corresponding in position to the first conductive pads, respectively, so as to expose the first conductive pads; cutting the overall structure along edges passing through the first metal layers; and separating the first metal layers from each other so as to form two initial substrates. The above-described method further comprises removing the first metal layers to expose the first assistant dielectric layers, and forming a plurality of openings in the first assistant dielectric layers to expose portions of the inner wiring layers.

The present invention further provides a method for fabricating a packaging substrate, which comprises the steps of: providing a base material, which comprises two first metal layers, each having a first surface and an opposed second surface, stacked together with the first surfaces thereof facing each other, two first assistant dielectric layers formed on the second surfaces of the first metal layers, respectively, and encapsulating the first metal layers, and two second metal layers formed on the exposed surfaces of the first assistant dielectric layers, respectively; patterning the second metal layers to form inner wiring layers, and forming a plurality of inner conductive vias in the first assistant dielectric layers to electrically connect the inner wiring layers and the first metal layers; forming built-up structures on the first assistant dielectric layers and the inner wiring layers, wherein the built-up structures each at least comprise a first dielectric layer, a first wiring layer formed on the first dielectric layer, and a plurality of first conductive vias formed in the first dielectric layer and electrically connecting the first wiring layer and the inner wiring layer, the first wiring layers disposed on an outermost portion of the built-up structures further have a plurality of first conductive pads; forming first insulating protective layers on the built-up structures to form an overall structure, and forming in the first insulating protective layers a plurality of openings corresponding in position to the first conductive pads, respectively, so as for the conductive pads to be exposed from the first insulating protective layers; cutting the overall structure along edges passing through the first metal layers; and separating the first metal layers from each other so as to form two initial substrates.

Fabrication of the base material comprises the steps of: providing the two first metal layers each having a first surface and an opposed second surface, and stacking the first metal layers together with the first surfaces thereof facing each other; stacking the first assistant dielectric layers on the second surfaces of the first metal layers; and stacking the second metal layers on the exposed surfaces of the first assistant dielectric layers, followed by laminating together the first metal layers, the first assistant dielectric layers and the second metal layers such that the two first assistant dielectric layers are bonded together to encapsulate the two first metal layers.

The method for fabricating a packaging substrate further comprises removing portions of the first metal layers so as to form a plurality of metal bumps connected to the inner conductive vias and/or metal support frames.

The present invention further provides a method for fabricating a packaging substrate, which comprises the steps of: providing a base material, which comprises two first metal layers each having a first surface and an opposed second surface, stacked together with the first surfaces thereof facing each other, two first assistant dielectric layers formed on the second surfaces of the first metal layers, respectively, and encapsulating the first metal layers, two core layers formed on the exposed surfaces of the first assistant dielectric layer, respectively, two second assistant dielectric layers formed on the exposed surfaces of the core layers, respectively, and two second metal layers formed on the exposed surfaces of the second assistant dielectric layers, respectively, wherein the two surfaces of each of the core layer have a plurality of first conductive lands and a plurality of second conductive lands, respectively, and the second conductive lands are positioned on the first assistant dielectric layers; patterning the second metal layers to form inner wiring layers, and forming a plurality of inner conductive vias in the second assistant dielectric layers to electrically connect the inner wiring layers and the first conductive lands; forming built-up structures on the second assistant dielectric layers and the inner wiring layers so as to form an overall structure, wherein the built-up structures each at least comprise a first dielectric layer, a first wiring layer formed on the first dielectric layer, and a plurality of first conductive vias formed in the first dielectric layer and electrically connecting the first wiring layer and the inner wiring layer; cutting the overall structure along edges passing through the first metal layers; and separating the first metal layers from each other so as to form two initial substrates.

Fabrication of the base material comprises the steps of: providing the two first metal layers each having a first surface and an opposed second surface and stacked together with the first surfaces thereof facing each other, the two first assistant dielectric layers formed on the second surfaces of the first metal layers, the two core layers formed on the exposed surfaces of the first assistant dielectric layers, the two second assistant dielectric layers formed on the exposed surfaces of the core layers, and the two second metal layers formed on the exposed surfaces of the second assistant dielectric layers; and laminating together the first metal layers, the first assistant dielectric layers, the core layers, the second assistant dielectric layers and the second metal layers such that the two first assistant dielectric layers are bonded together to encapsulate the two first metal layers, and the second conductive lands are embedded in the first assistant dielectric layers.

In the above-described method for fabricating a packaging substrate, the first wiring layers disposed on an outermost portion of the built-up structures further have a plurality of first conductive pads, and first insulating protective layers are formed on the built-up structures and formed therein with a plurality of openings corresponding in position to the first conductive pads, respectively, so as for the first conductive pads to be exposed from the first insulating protective layers.

The method further comprises patterning the first metal layers so as to form second wiring layers, and forming a plurality of second conductive vias in the first assistant dielectric layers to electrically connect the second conductive lands and the second wiring layers, wherein the second wiring layers further comprise a plurality of second conductive pads, and second insulating protective layers are formed on the first assistant dielectric layers and formed therein with a plurality of openings corresponding in position to the second conductive pads, respectively, so as for the second conductive pads to be exposed from the second insulating protective layers.

In the above-described three methods for fabricating a packaging substrate, the first surfaces of the first metal layers are smooth surfaces, and the second surfaces of the first metal layers are rough surfaces.

Therefore, the present invention involves stacking two metal layers together, encapsulating the two metal layers with assistant dielectric layers, forming built-up structures on the assistant dielectric layers, and finally separating the built-up structures along the interface between the two metal layers so as to form two packaging substrates. Owing to the adhesive characteristic of the assistant dielectric layers, the two metal layers are unlikely to separate from each other during the formation of the built-up structures. But after the portions of the assistant dielectric layers around the periphery of the two metal layers are cut and removed, the two metal layers can be readily separated from each other. The two metal layers can further be patterned to form wiring layers, metal bumps, or supporting structures so as to avoid waste of materials and dispense with the formation of the releasing layer or adhesive layer on the temporary carrier as in the prior art, thereby simplifying the fabrication processes and reducing the cost.

Furthermore, the metal bumps protrude above the chip-mounting surface of the packaging substrate to replace the conventional conductive pads exposed from the openings of a solder mask layer, thereby dispensing with the process of forming the solder mask layer and the process of forming solder bumps on the conductive pads as in the prior art. Therefore, the present invention reduces fabrication costs but increases the product yield.

DETAILED DESCRIPTION OF PREFERRED EMBODIMENTS

The following illustrative embodiments are provided to illustrate the disclosure of the present invention, these and other advantages and effects can be apparent to those in the art after reading this specification. It should be noted that in the following embodiments, the method for forming wiring layers is well known in the art and detailed description thereof is omitted therein.

First Embodiment

FIGS. 2A to 2F are sectional views showing a packaging substrate and a method for fabricating the same according to a first embodiment of the present invention.

Figure 1A:
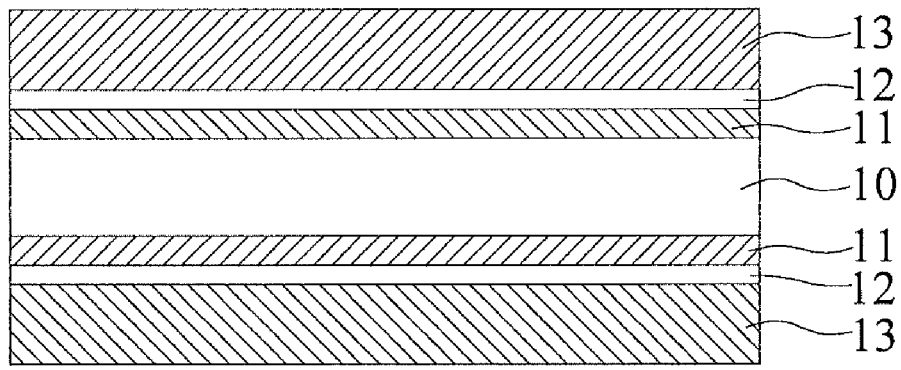
FIGS. 1A to 1F are sectional views showing a conventional packaging substrate and a method for fabricating the same.
Figure 1B:
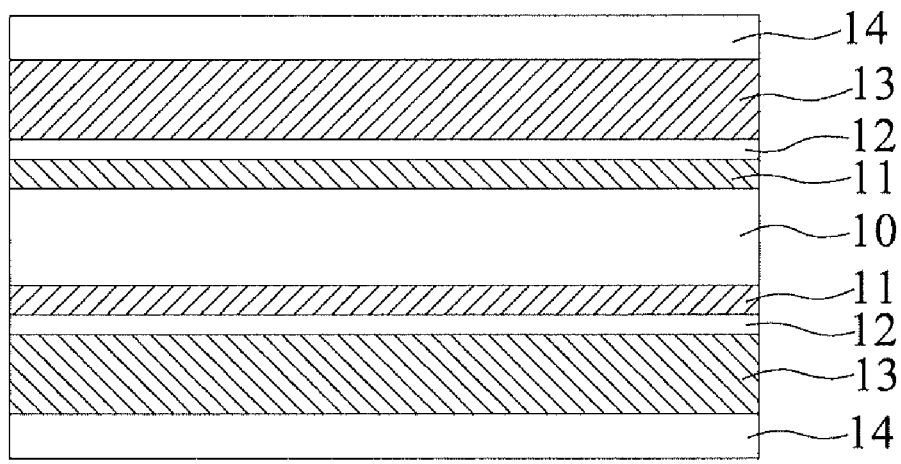
Figure 1C:
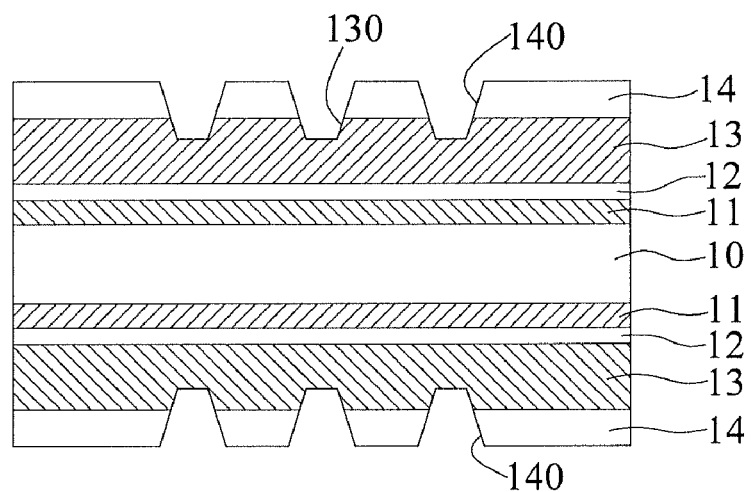
Figure 1D:
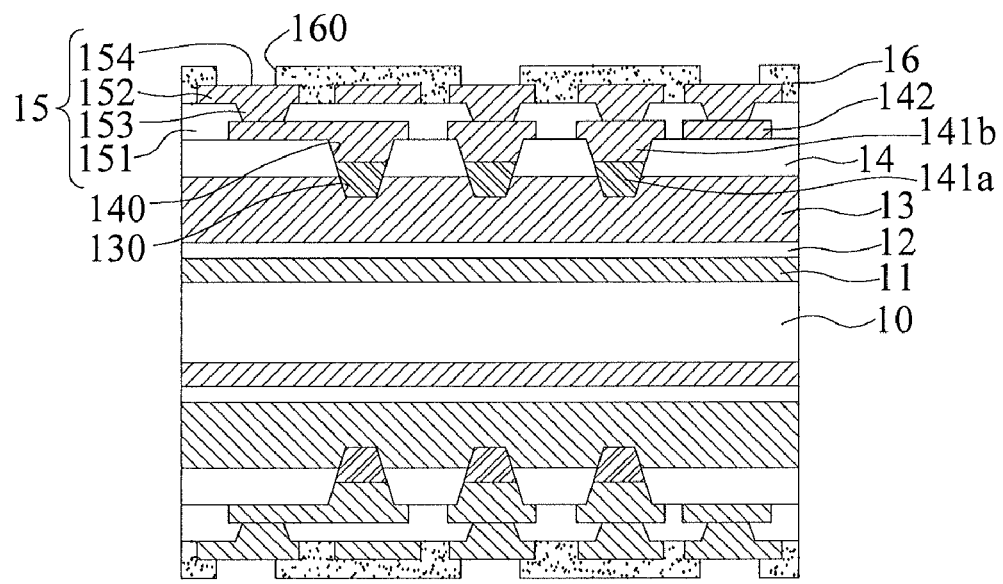
Figure 1E:
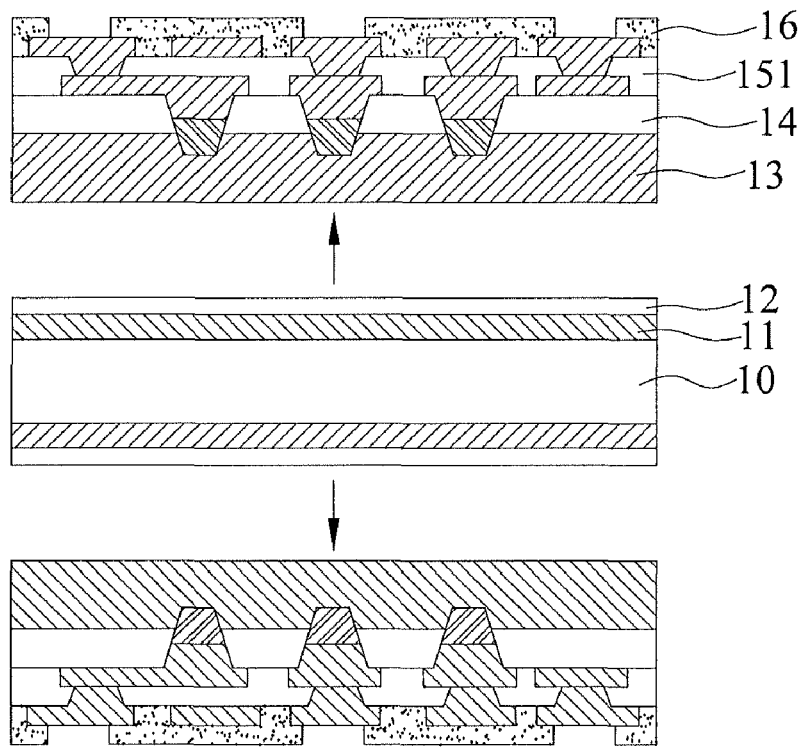
Figure 1F:
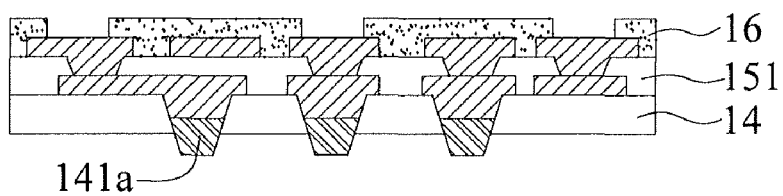
Figure 2A:
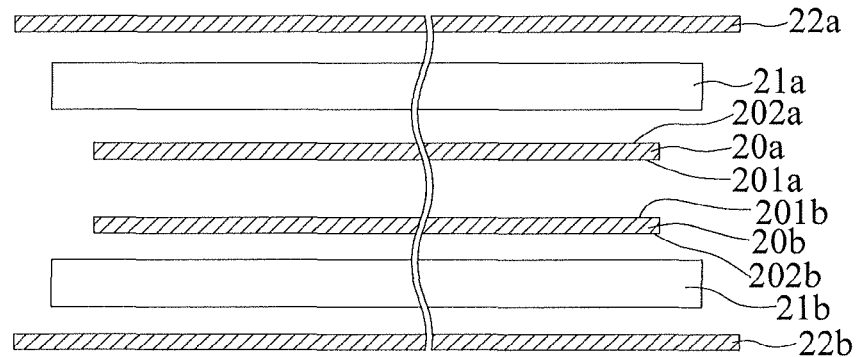
FIGS. 2A to 2F are sectional views showing a packaging substrate and a method for fabricating the same according to a first embodiment of the present invention.

Referring to FIG. 2A, two first metal layers 20a, 20b respectively having first surfaces 201a, 201b and opposite second surfaces 202a, 202b are stacked together with the first surfaces 201a, 201b thereof facing each other; two first assistant dielectric layers 21a, 21b are formed on the second surfaces 202a, 202b of the first metal layers 20a, 20b, respectively; and two second metal layers 22a, 22b are formed on the exposed surfaces of the first assistant dielectric layers 21a, 21b, respectively, which can have a thickness greater than the thickness of the first metal layers 20a, 20b so as to provide sufficient rigidity.

In the present embodiment, the first surfaces 201a, 201b are smooth surfaces, and the second surfaces 202a, 202b are rough surfaces.

Figure 2B:
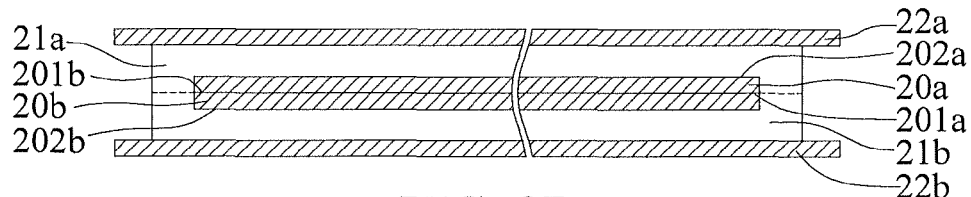

Referring to FIG. 2B, the first metal layers 20a, 20b, the first assistant dielectric layers 21a, 21b and the second metal layers 22a, 22b are laminated together such that the first assistant dielectric layers 21a, 21b are bonded together to encapsulate the first metal layers 20a, 20b, thereby forming a base material. Therein, the two first metal layers 20a 20b are in contact with each other through the first surfaces 201a, 201b thereof.

Figure 2C:
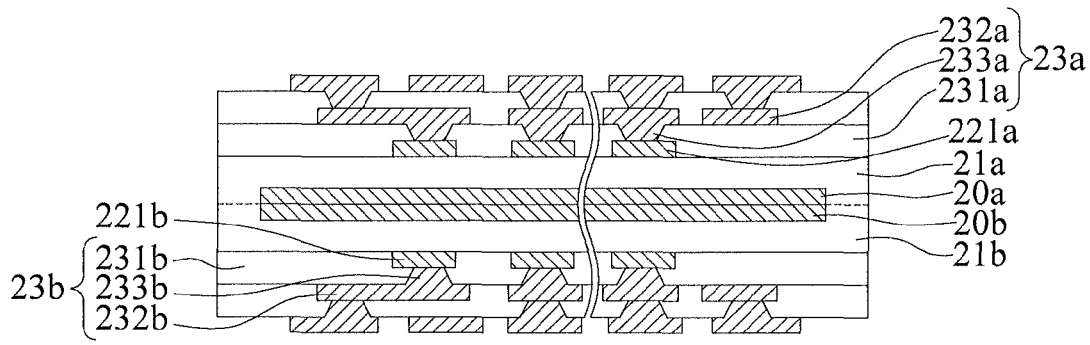

Referring to FIG. 2C, the second metal layers 22a, 22b are patterned so as to form inner wiring layers 221a, 221b, and built-up structures 23a, 23b are formed on the first assistant dielectric layers 21a, 21b and the inner wiring layers 221a, 221b, respectively. The built-up structures 23a, 23b comprise at least first dielectric layers 231a, 231b, first wiring layers 232a, 232b formed on the first dielectric layers 231a, 231b, and a plurality of first conductive vias 233a, 233b formed in the first dielectric layers 231a, 231b and electrically connecting the inner wiring layers 221a, 221b and the first wiring layers 232a, 232b, respectively.

Figure 2D:
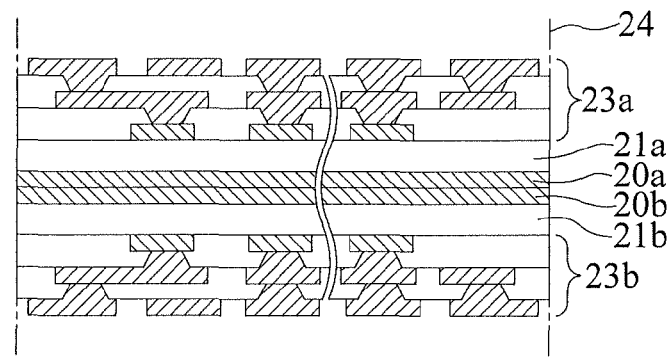

Referring to FIG. 2D, the overall structure is cut along cutting edges 24 passing through the first metal layers 20a, 20b.

Figure 2E:
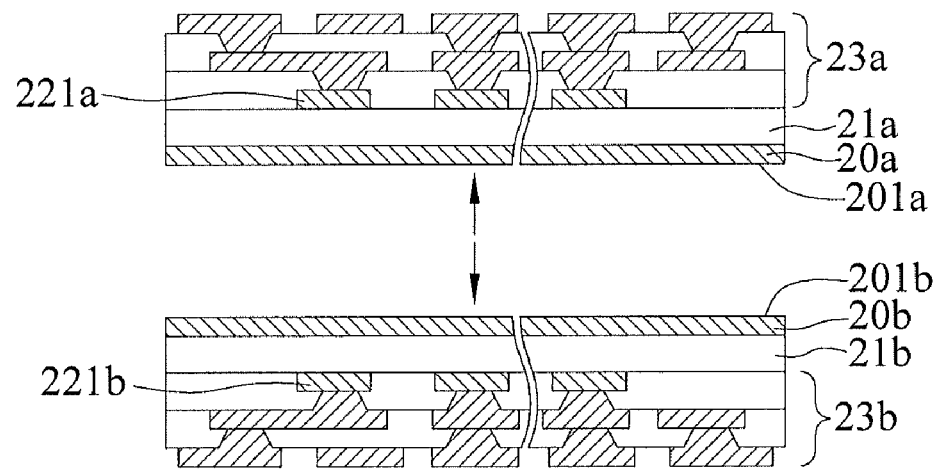

Referring to FIG. 2E, before the cutting process, the first metal layers 20a, 20b are encapsulated by the two first assistant dielectric layers 21a, 21b and thus difficult to separate from each other. But after the portions of the assistant dielectric layers around the periphery of the two metal layers are cut and removed by the cutting process, the first metal layers 20a, 20b can be readily separated from each other so as to form two initial substrates. It should be noted that the subsequent processes are illustrated and exemplified by one of the initial substrates.

Figure 2F:
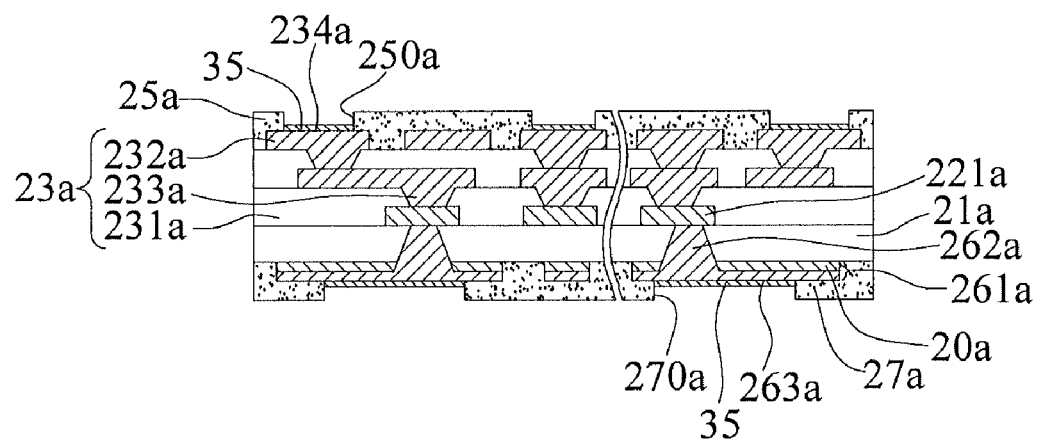

As shown in FIG. 2F, the first wiring layer 232a disposed on an outermost portion of the built-up structure 23a has a plurality of first conductive pads 234a, and a first insulating protective layer 25a, such as a solder mask layer, is formed on the outmost layer of the built-up structure 23a. A plurality of openings 250a corresponding in position to the first conductive pads 234a, respectively, are formed in the first insulating protective layer 25a so as for the first conductive pads 234a to be exposed from the first insulating protective layer 25a. Further, the first metal layer 20a is patterned to form a second wiring layer 261a on the first assistant dielectric layer 21a, and a plurality of second conductive vias 262a are formed in the first assistant dielectric layer 21a to electrically connect the inner wiring layer 221a and the second wiring layer 261a. The second wiring layer 261a is provided thereon with a plurality of second conductive pads 263a. A second insulating protective layer 27a, such as a solder mask layer, is formed on the first assistant dielectric layer 21a and the second wiring layer 261a. A plurality of openings 270a corresponding in position to the second conductive pads 263a, respectively, are formed in the second insulating protective layer 27a so as for the conductive pads 263a to be exposed from the second insulating protective layer 27a.

In addition, a surface treatment layer 35 made of organic solderability preservatives (OSP), electroless nickel/electroless palladium immersion gold (ENEPIG), or immersion tin (IT) is formed on the first conductive pads 234a and the second conductive pads 263a. Thus, the fabrication process of a packaging substrate is completed. The first conductive pads 234a are to be mounted thereon with a semiconductor chip (not shown) and the second conductive pads 263a are to be mounted thereon with a printed circuit board (not shown).

Referring to FIG. 2B, the present invention further discloses a base material used for fabricating a coreless packaging substrate, which comprises: the first metal layers 20a, 20b respectively having the first surfaces 201a, 201b and opposite second surfaces 202a, 202b and stacked together with the first surfaces 201a, 201b thereof facing each other; the first assistant dielectric layers 21a, 21b formed on the second surfaces 202a, 202b of the first metal layers 20a, 20b, respectively; and the second metal layers 22a, 22b formed on the exposed surfaces of the first assistant dielectric layers 21a, 21b, respectively, wherein the first assistant dielectric layers 21a, 21b are bonded together to encapsulate the first metal layers 20a, 20b.

In the above-described base material, the first surfaces 201a, 201b are smooth surfaces, and the second surfaces 202a, 202b are rough surfaces.

Second Embodiment

FIGS. 3A to 3D are sectional views showing a packaging substrate and a method for fabricating the same according to a second embodiment of the present invention.

Figure 3A:
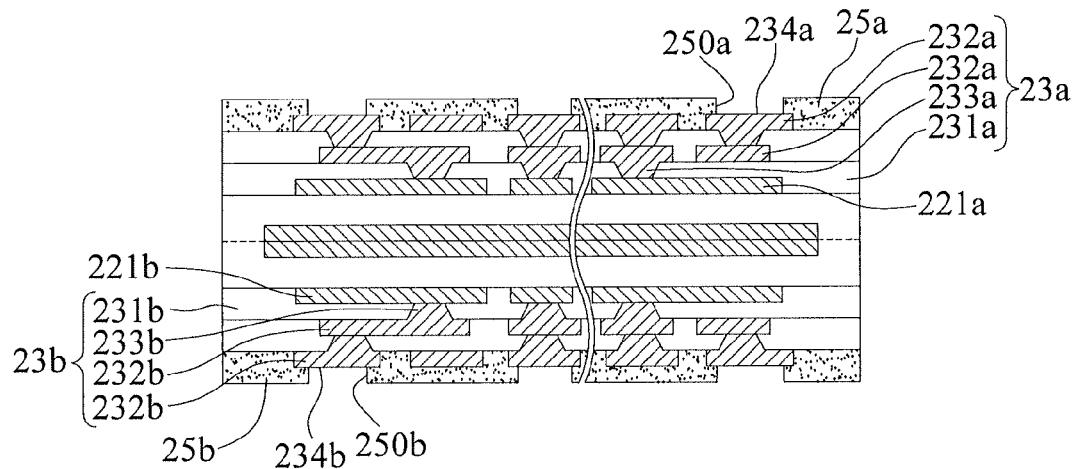
FIGS. 3A to 3D are sectional views showing a packaging substrate and a method for fabricating the same according to a second embodiment of the present invention.

Referring to FIG. 3A, a structure as shown in FIG. 2C is obtained, the first wiring layers 232a, 232b disposed on an outermost portion of the built-up structures 23a, 23b have a plurality of first conductive pads 234a, 234b, respectively. First insulating protective layers 25a, 25b, such as solder mask layers, are formed on the outmost layers of the built-up structures 23a, 23b. A plurality of openings 250a, 250b corresponding in position to the first conductive pads 234a, 234b, respectively, are formed in the first insulating protective layers 25a, 25b so as for the first conductive pads 234a, 234b to be exposed from the first insulating protective layers 25a, 25b.

Figure 3B:
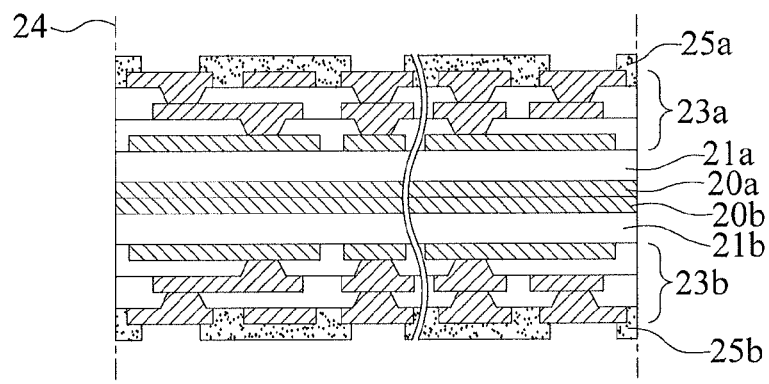

Referring to FIG. 3B, the overall structure is cut along cutting edges 24 passing through the first metal layers 20a, 20b.

Figure 3C:
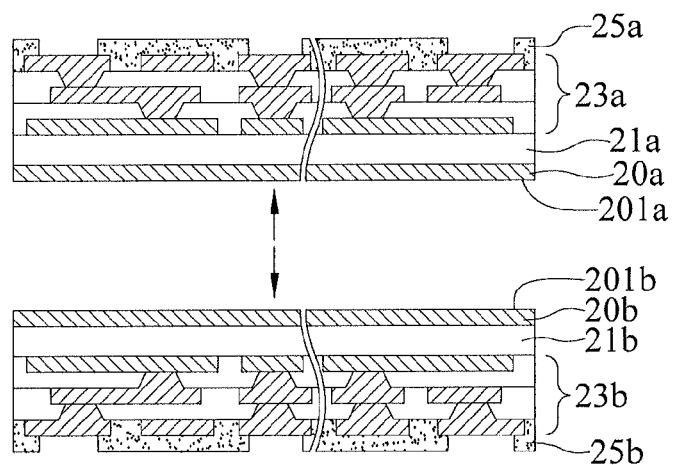

Referring to FIG. 3C, the first metal layers 20a, 20b are separated from each other so as to form two initial substrates. It should be noted that the subsequent processes are illustrated and exemplified by one of the initial substrates.

Figure 3D:
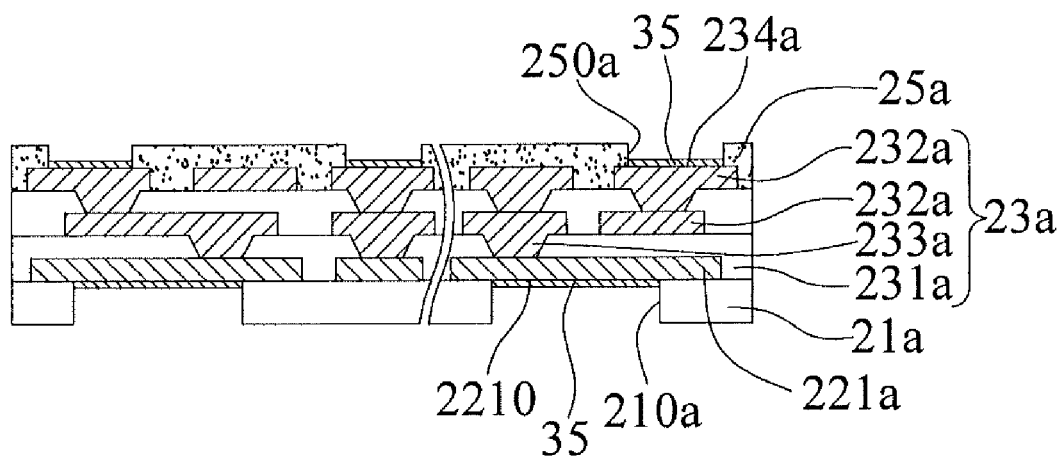

As shown in FIG. 3D, the first metal layer 20a is removed so as to expose the first assistant dielectric layer 21a, and a plurality of openings 210a are formed in the first assistant dielectric layer 21a such that portions of the inner wiring layer 221a are exposed from the openings 210a to thereby serve as third conductive pads 2210; and the surface treatment layer 35 is formed on the first conductive pads 234a and the third conductive pads 2210. Thus, the fabrication process of a packaging substrate is completed, wherein the first conductive pads 234a are to be mounted thereon with a semiconductor chip (not shown) and the third conductive pads 2210 are to be mounted thereon with a printed circuit board (not shown).

Third Embodiment

Figure 4A:
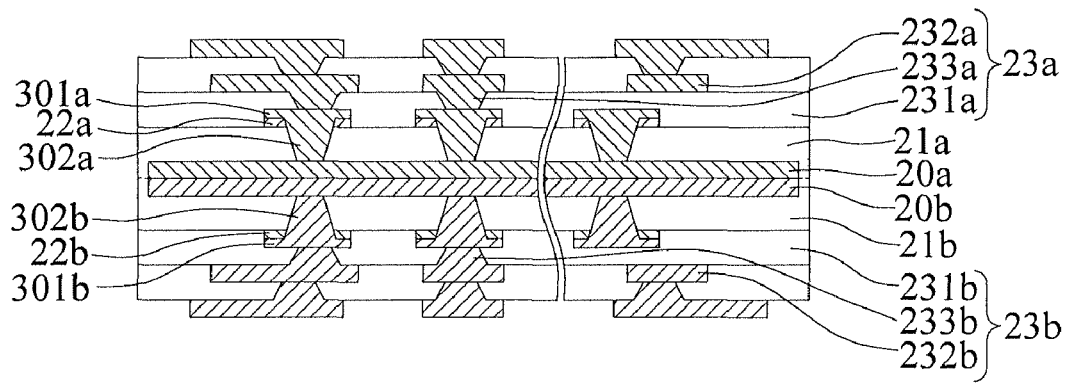
FIGS. 4A to 4F are sectional views showing a packaging substrate and a method for fabricating the same according to a third embodiment of the present invention, wherein FIGS. 4E' and 4F' illustrate another embodiment of FIGS. 4E and 4F.
Figure 4B:
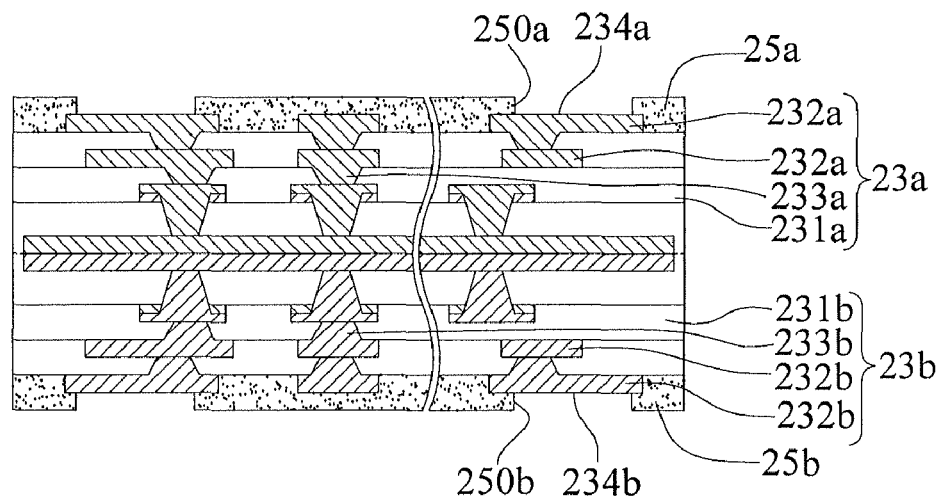
Figure 4C:
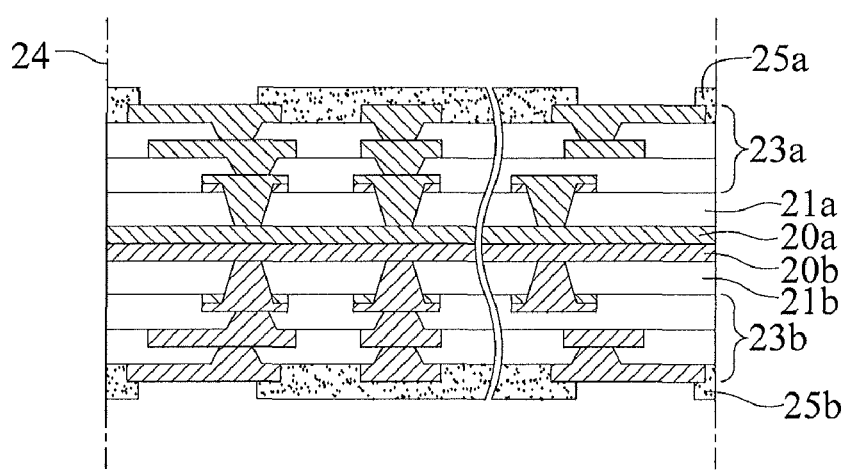
Figure 4D:
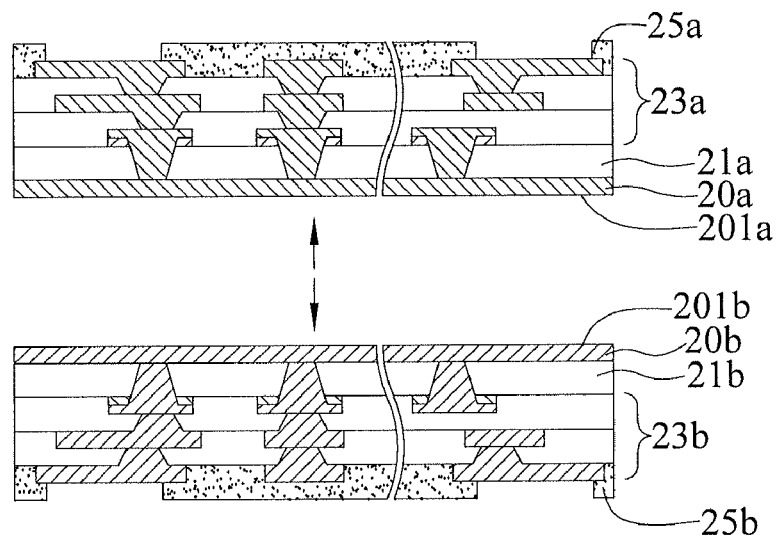
Figure 4E:
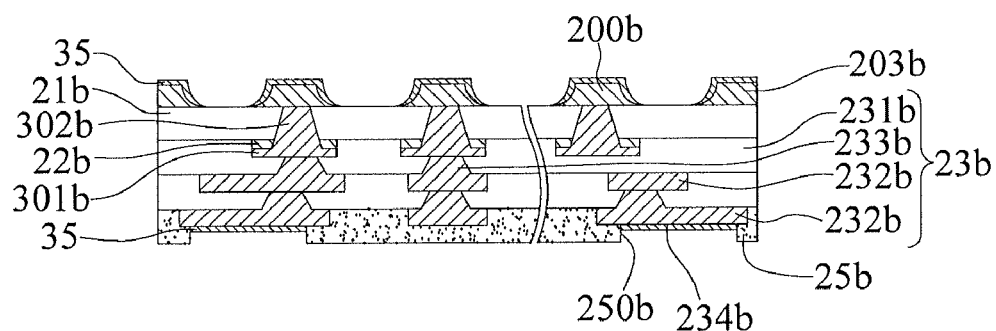
Figure 4F:
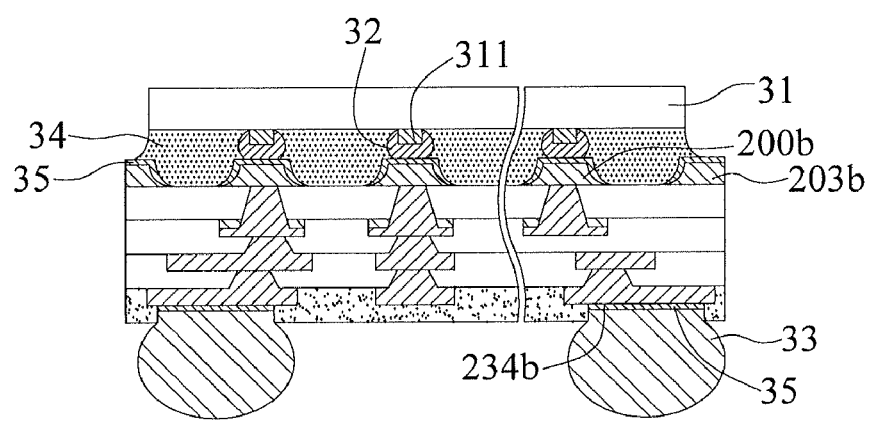
Figure 4E:
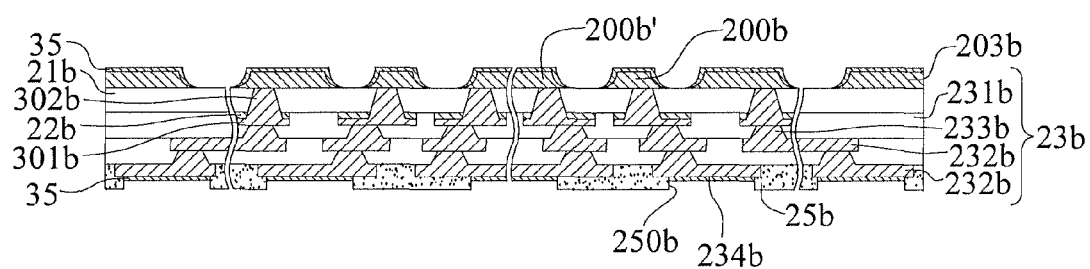
Figure 4F:
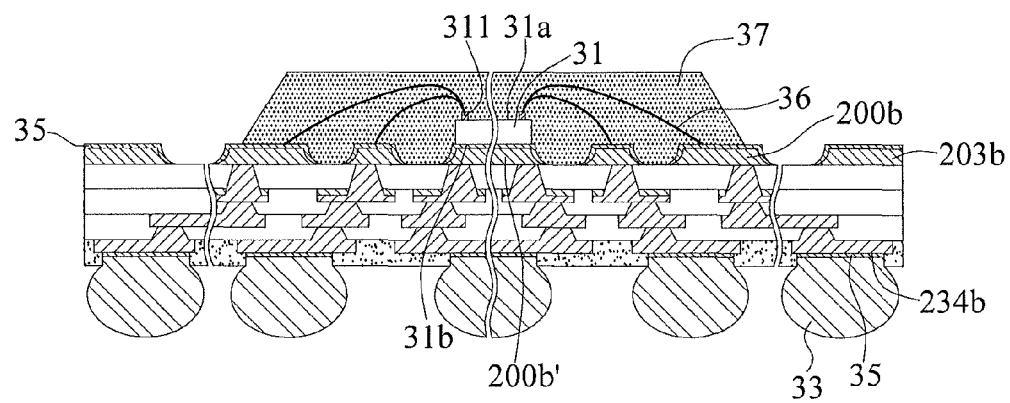

FIGS. 4A to 4F are sectional views showing a packaging substrate and a method for fabricating the same according to a third embodiment of the present invention, wherein FIGS. 4E' and 4F' show another embodiment of FIGS. 4E and 4F.

Referring to FIG. 4A, a structure as shown in FIG. 2B is obtained, and the second metal layers 22a, 22b are patterned so as to form inner wiring layers 301a, 301b. A plurality of inner conductive vias 302a, 302b are formed in the first assistant dielectric layers 21a, 21b to electrically connect the inner wiring layers 301a, 301b and the first metal layers 20a, 20b. The built-up structures 23a, 23b are formed on the first assistant dielectric layers 21a, 21b and inner wiring layers 301a, 301b. The built-up structures 23a, 23b at least comprise first dielectric layers 231a, 231b, first wiring layers 232a, 232b formed on the first dielectric layers 231a, 231b, and a plurality of first conductive vias 233a, 233b formed in the first dielectric layers 231a, 231b and electrically connecting the inner wiring layers 301a, 301b and the first wiring layers 232a, 232b, respectively.

Referring to FIG. 4B, the first wiring layers 232a, 232b disposed on an outermost portion of the built-up structures 23a, 23b have a plurality of first conductive pads 234a, 234b. First insulating protective layers 25a, 25b, such as solder mask layers, are formed on the outmost layers of the built-up structures 23a, 23b. A plurality of openings 250a, 250b corresponding in position to the first conductive pads 234a, 234b, respectively, are formed in the first insulating protective layers 25a, 25b so as for the first conductive pads 234a, 234b to be exposed from the first insulating protective layers 25a, 25b, respectively.

Referring to FIG. 4C, the overall structure is cut along cutting edges 24 passing through the metal layers 20a, 20b.

Referring to FIG. 4D, the first metal layers 20a, 20b are separated from each other so as to form two initial substrates. It should be noted that the subsequent processes are illustrated and exemplified by one of the initial substrates.

As shown in FIG. 4E, the first metal layer 20b is patterned to remove portions of the first metal layer 20b, thereby forming a metal support frame 203b at the outer periphery of the initial substrate and forming a plurality of metal bumps 200b corresponding in position and electrically connected to the inner conductive vias 302b, respectively. Further, the surface treatment layer 35 is formed on the metal support frame 203b, the metal bumps 200b and the first conductive pads 234b. Thus, the fabrication process of a packaging substrate is completed.

Referring to FIG. 4F, a semiconductor chip 31 is mounted on the packaging substrate. A plurality of electrode pads 311 are provided on the active surface of the semiconductor chip 31. The electrode pads 311 are electrically connected to the metal bumps 200b through a plurality of solder bumps 32. An underfill material 34 fills the space between the semiconductor chip 31 and the packaging substrate. A plurality of solder balls 33 are formed on the surface treatment layer 35 on the first conductive pads 234a.

Further referring to FIGS. 4E' and 4F', the metal bumps 200b are used as wire bonding pads. When portions of the first metal layer 20b are removed through a patterning processing, a heat sink 200b' with a large surface area is formed to be connected to the inner conductive vias 302b, and the wire bonding pads surround the heat sink 200b'. The heat sink 200b' is used for mounting the inactive surface 31b of the semiconductor chip 31. Referring to FIG. 4F', the heat sink 200b' can rapidly dissipate heat generated by the semiconductor chip 31 to the outside so as to avoid overheating the semiconductor chip 31. The electrode pads 311 on the active surface 31a of the semiconductor chip 31 are electrically connected to the metal bumps 200b through a plurality of bonding wires 36. Further, a molding compound 37 is formed to encapsulate the semiconductor chip 31, bonding wires 36 and metal bumps 200b, and a plurality of solder balls 33 are formed on the surface treatment layer 35 on the first conductive pads 234a.

Referring to FIGS. 4E and 4E', the present invention further provides a packaging substrate comprising: a first assistant dielectric layer 21b disposed on a surface thereof with an inner wiring layer 301b and having a plurality of inner conductive vias 302b electrically connecting to the inner wiring layer 301b; a plurality of metal bumps 200b disposed on the other surface of the first assistant dielectric layer 21b and electrically connected to the inner conductive vias 302b; a built-up structure 23 disposed on the first assistant dielectric layer 21b and the inner wiring layer 301b, wherein the built-up structure 23 comprises at least the first dielectric layer 231b, the first wiring layer 232b disposed on the first dielectric layer 231b, and a plurality of first conductive vias 233b disposed in the first dielectric layer 231b so as to electrically connect the inner wiring layer 301b and the first wiring layer 232b, the first wiring layer 232b disposed on an outermost portion of the built-up structure 23b has a plurality of first conductive pads 234b; and a first insulating protective layer 25b, such as a solder mask layer, disposed on an outermost portion of the built-up structure 23b and having a plurality of openings 250b corresponding in position to the first conductive pads 234b, respectively, so as to expose the first conductive pads 234b. The inner wiring layer 301b and a corresponding one of the metal bumps 200b are electrically connected to a wire-connected end and a bump-connected end of each of the inner conductive vias 302b, respectively, and the wire-connected end has a larger diameter than the bump-connected end.

In the above-described packaging substrate, the metal bumps 200b function as solder pads for a flip-chip package, as shown in FIG. 4E; alternatively, the metal bumps 200b are used for a wire bonding package, which comprise a heat sink 200b' with a large surface area and a plurality of wire bonding pads surrounding the periphery of the heat sink 200b', as shown in FIG. 4E'.

The above-described packaging substrate further comprises a metal support frame 203b disposed on the first assistant dielectric layer 21b.

Referring to FIG. 4F, a semiconductor chip 31 is mounted on the packaging substrate of FIG. 4E so as to form a package structure according to the present invention. The electrode pads 311 on the active surface of the semiconductor chip 31 are electrically connected to the metal bumps 200b through the solder bumps 32. The underfill material 34 fills the space between the semiconductor chip 31 and the packaging substrate. The solder balls 33 are formed on the surface treatment layer 35 of the first conductive pads 234b.

Further referring to FIG. 4F', another package structure using the packaging substrate of FIG. 4E' is provided, wherein the semiconductor chip 31 having an active surface 31a and an inactive surface 31b is mounted on the heat sink 200b' via the inactive surface 31b thereof. The electrode pads 311 on the active surface 31a of the semiconductor chip 31 are electrically connected to the metal bumps 200b serving as wire bonding pads through the bonding wires 36. The molding compound 37 is formed on the semiconductor chip 31 and the packaging substrate so as to encapsulate the semiconductor chip 31, the bonding wires 36 and the metal bumps 200b, and the solder balls 33 are formed on the surface treatment layer 35 of the first conductive pads 234b.

Fourth Embodiment

FIGS. 5A to 5G are sectional views showing a packaging substrate and a method for fabricating the same according to a fourth embodiment of the present invention.

Figure 5A:
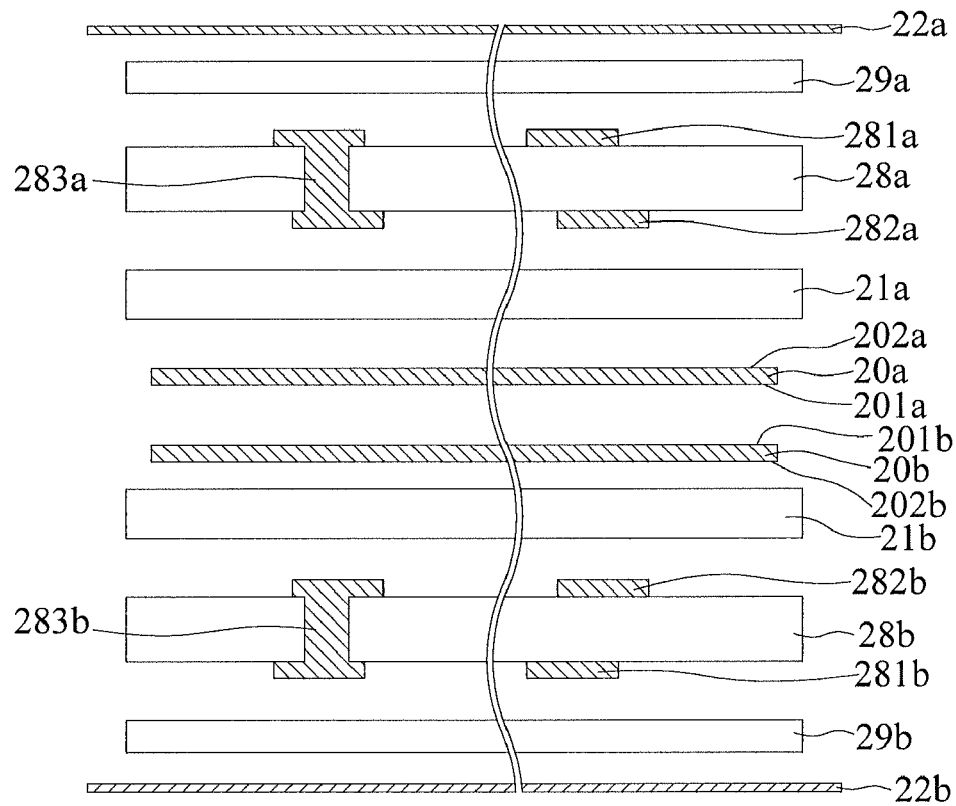
FIGS. 5A to 5G are sectional views showing a packaging substrate and a method for fabricating the same according to a fourth embodiment of the present invention.

Referring to FIG. 5A, two first metal layers 20a, 20b respectively having first surfaces 201a, 201b and opposite second surfaces 202a, 202b are stacked together with the first surfaces 201a, 201b thereof facing each other; two first assistant dielectric layers 21a, 21b are formed on the second surfaces 202a, 202b of the first metal layers 20a, 20b, respectively; two core layers 28a, 28b are formed on the exposed surfaces of the first assistant dielectric layers 21a, 21b, respectively; two assistant dielectric layers 29a, 29b are formed on the exposed surfaces of the core layers 28a, 28b, respectively; and two second metal layers 22a, 22b are formed on the exposed surfaces of the second assistant dielectric layers 29a, 29b, respectively, the core layers 28a, 28b having first conductive lands 281a, 281b and second conductive lands 282a, 282b formed on the surfaces thereof, and conductive vias 283a, 283b being formed in the core layers 28a, 28b to electrically connect the first conductive lands 281a, 281b and second conductive lands 282a, 282b, respectively.

In the present embodiment, the first surfaces 201a, 201b are smooth surfaces, and the second surfaces 202a, 202b are rough surfaces.

Figure 5B:
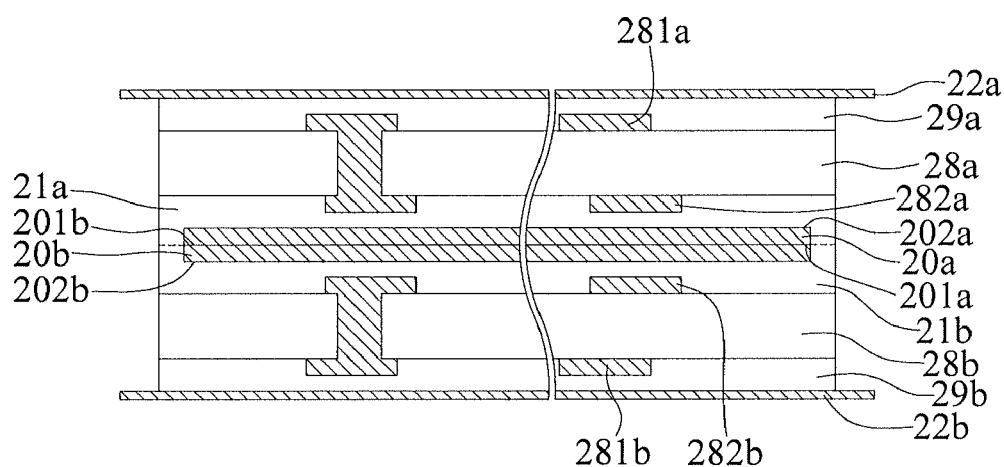

Referring to FIG. 5B, the first metal layers 20a, 20b, the first assistant dielectric layers 21a, 21b, the core layers 28a, 28b, the second assistant dielectric layers 29a, 29b, and the second metal layers 22a, 22b are laminated together such that the first assistant dielectric layers 21a, 21b are bonded together to encapsulate the first metal layers 20a, 20b, the first metal layers 20a 20b being in contact with each other through the first surfaces 201a, 201b thereof. Further, the first conductive lands 281a, 281b are embedded in the second assistant dielectric layers 29a, 29b, respectively, and the second conductive lands 282a, 282b are embedded in the first assistant dielectric layers 21a, 21b, respectively.

Figure 5C:
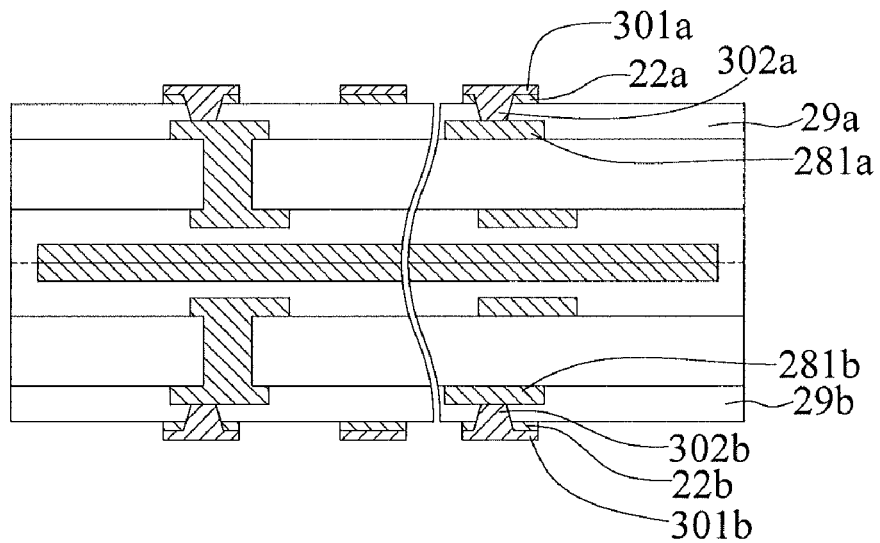

Referring to FIG. 5C, the second metal layers 22a, 22b are patterned so as to form inner wiring layers 301a, 301b, and inner conductive vias 302a, 302b are formed in the second assistant dielectric layers 29a, 29b to electrically connect the inner wiring layers 301a, 301b and the first conductive lands 281a, 281b.

Figure 5D:
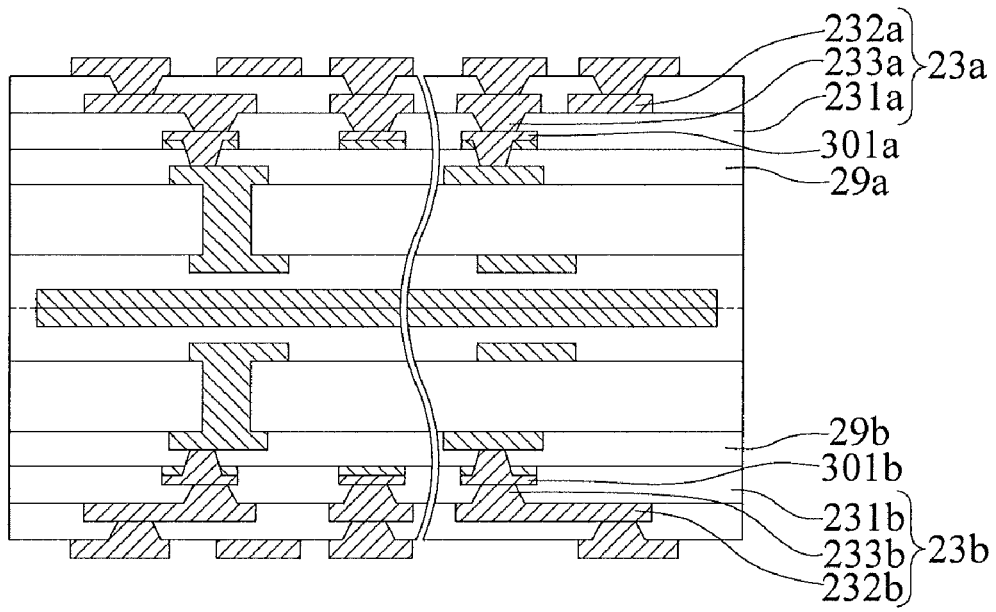

Referring to FIG. 5D, built-up structures 23a, 23b are formed on the second assistant dielectric layers 29a, 29b and the inner wiring layers 301a, 301b, respectively. The built-up structures 23a, 23b at least comprise first dielectric layers 231a, 231b, first wiring layers 232a, 232b formed on the first dielectric layers 231a, 231b, and a plurality of first conductive vias 233a, 233b formed in the first dielectric layers 231a, 231b and electrically connecting the inner wiring layers 301a, 301b and the first wiring layers 232a, 232b, respectively.

Figure 5E:
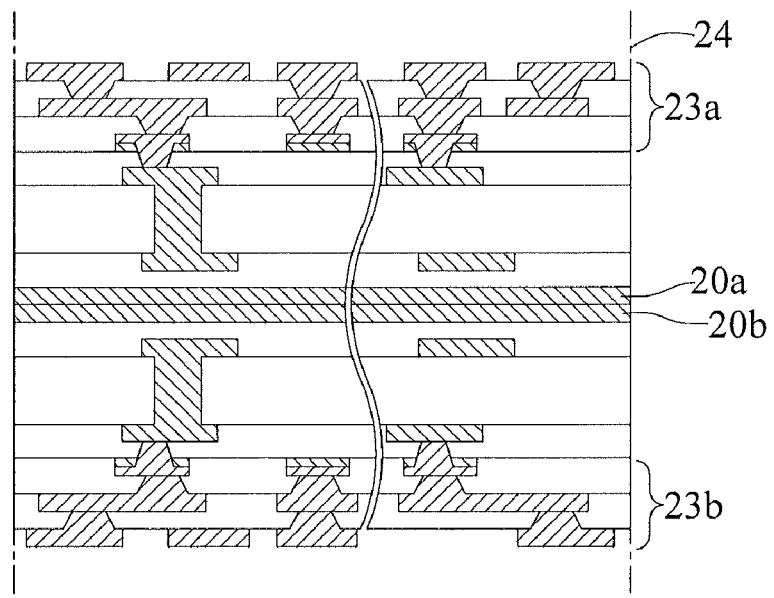

Referring to FIG. 5E, the overall structure is cut along cutting edges 24 passing through the first metal layers 20a, 20b.

Figure 5F:
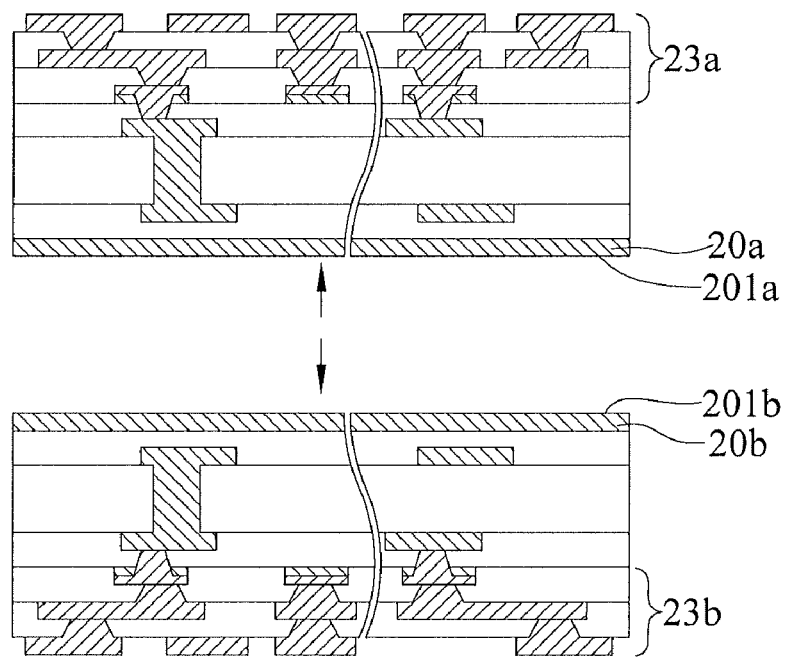

Referring to FIG. 5F, the first metal layers 20a, 20b are separated from each other so as to form two initial substrates. It should be noted that the subsequent processes are illustrated and exemplified by one of the initial substrates.

Figure 5G:
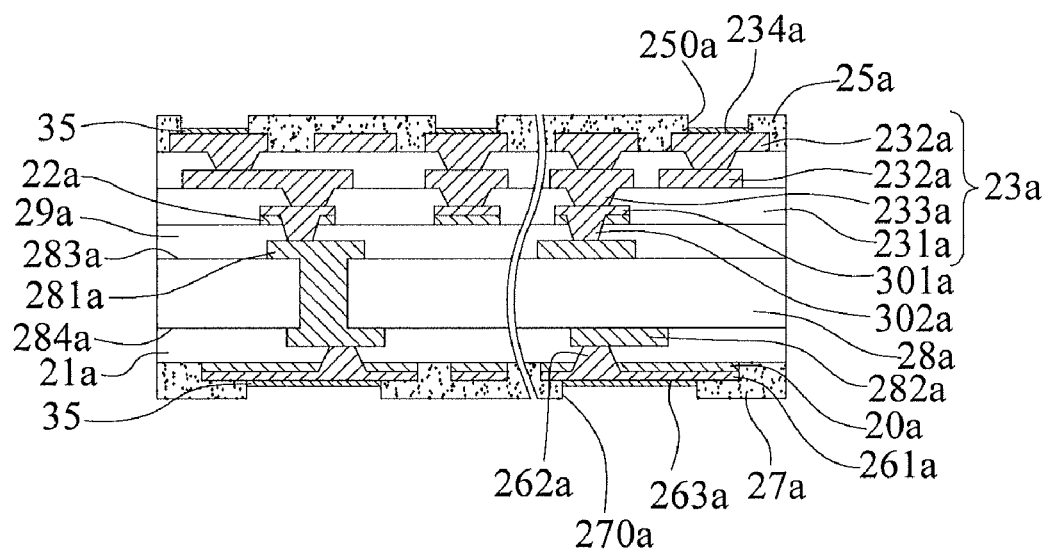

As shown in FIG. 5G, the first wiring layer 232a disposed on an outermost portion of the built-up structure 23a has a plurality of first conductive pads 234a, and a first insulating protective layer 25a, such as a solder mask layer, is formed on the outmost layer of the built-up structure 23a. A plurality of openings 250a corresponding in position to the first conductive pads 234a, respectively, are formed in the first insulating protective layer 25a so as for the first conductive pads 234a to be exposed from the first insulating protective layer 25a.

Further, the first metal layer 20a is patterned to form a second wiring layer 261a on the first assistant dielectric layer 21a, and a plurality of second conductive vias 262a are formed in the first assistant dielectric layer 21a to electrically connect the second conductive lands 282a and the second wiring layer 261a. The second wiring layer 261a is provided thereon with a plurality of second conductive pads 263a. A second insulating protective layer 27a, such as a solder mask layer, is formed on the first assistant dielectric layer 21a. A plurality of openings 270a corresponding in position to the second conductive pads 263a, respectively, are formed in the second insulating protective layer 27a so as for the conductive pads 263a to be exposed from the second insulating protective layer 27a.

In addition, a surface treatment layer 25 can be formed on the first conductive pads 234a and the second conductive pads 263a. Thus, the fabrication process of a packaging substrate is completed. The first conductive pads 234a can be used for mounting a semiconductor chip (not shown) thereon and the second conductive pads 263a can be used for mounting a printed circuit board (not shown) thereon.

Referring to FIG. 5B, the present invention further discloses a base material used for fabricating a packaging substrate with a thin core layer. The base material comprises: the first metal layers 20a, 20b respectively having the first surfaces 201a, 201b and opposite second surfaces 202a, 202b and stacked together with the first surfaces 201a, 201b thereof facing each other; the first assistant dielectric layers 21a, 21b formed on the second surfaces 202a, 202b of the first metal layers 20a, 20b, respectively; the core layers 28a, 28b formed on the exposed surfaces of the first assistant dielectric layers 21a, 21b, respectively; the second assistant dielectric layers 29a, 29b formed on the exposed surfaces of the core layers 28a, 28b, respectively; and the second metal layers 22a, 22b formed on the exposed surfaces of the second assistant dielectric layers 29a, 29b, respectively, wherein the first metal layers 20a 20b are in contact with each other through the first surfaces 201a, 201b thereof, and the two first assistant dielectric layers 21a, 21b are bonded together to encapsulate the first metal layers 20a, 20b, and the core layers 28a, 28b, the second assistant dielectric layers 29a, 29b and the second metal layers 22a, 22b are laminated in sequence onto the first assistant dielectric layers 21a, 21b.

In the above-described base material, the first surfaces 201a, 201b are smooth surfaces, and the second surfaces 202a, 202b are rough surfaces.

In the present embodiment, a packaging substrate with a thin core layer is obtained. The thin core layer has a thickness less than 0.2 mm. In the prior art, such a feeding plate is easy to warp due to liquid, spraying pressure or gravity of an air knife in a fabrication process, thereby easily causing damage or stuck of the plate during a transportation process and even shut down of the product line. But the packaging substrate with the thin core layer according to the present invention has high rigidity and accordingly overcomes the conventional drawbacks.

Therefore, the present invention stacks two metal layers together, encapsulates the metal layers with assistant dielectric layers, forms built-up structures on the assistant dielectric layers, and separate the built-up structures along the interface between the two metal layers so as to form two packaging substrates. Owing to the adhesive characteristic of the assistant dielectric layers, the two metal layers are unlikely to separate from each other during the formation of the built-up structures. But after the portions of the assistant dielectric layers around the periphery of the two metal layers are cut and removed, the two metal layers can be readily separated from each other. The two metal layers can further be patterned to form wiring layers, metal bumps, or supporting structures so as to avoid waste of materials and dispense with the formation of the releasing layer or adhesive layer on the temporary carrier as in the prior art, thereby simplifying the fabrication processes and reducing the cost.

Furthermore, the metal bumps protrude above the chip-mounting surface of the packaging substrate to replace the conventional conductive pads exposed from the openings of a solder mask layer, thereby dispensing with the process of forming the solder mask layer and the process of forming solder bumps on the conductive pads otherwise disclosed in the prior art. Therefore, the present invention reduces fabrication costs but increases the product yield.

The above embodiments are illustrated to disclose the preferred implementation according to the present invention but not intended to limit the scope of the present invention, Accordingly, all modifications and variations completed by those with ordinary skill in the art should fall within the scope of present invention defined by the appended claims.

What is claimed is:

1. A packaging substrate, comprising:

a first assistant dielectric layer having an inner wiring layer disposed on a surface thereof and a plurality of inner conductive vias disposed therein to electrically connect to the inner wiring layer;

a plurality of metal bumps disposed on another surface of the first assistant dielectric layer and electrically connected to the inner conductive vias, wherein the inner wiring layer and a corresponding one of the metal bumps are electrically connected to a wire-connected end and a bump-connected end of each of the inner conductive vias, respectively, and the wire-connected end has a larger diameter than the bump-connected end;

a built-up structure disposed on the first assistant dielectric layer and the inner wiring layer, wherein the built-up structure comprises at least a first dielectric layer, a first wiring layer disposed on the first dielectric layer, and a plurality of first conductive vias disposed in the first dielectric layer and electrically connecting the first wiring layer and the inner wiring layer, and the first wiring layer disposed on an outermost portion of the built-up structure has a plurality of first conductive pads; and a first insulating protective layer disposed on the built-up structure and having a plurality of openings corresponding in position to the first conductive pads, respectively, so as for the first conductive pads to be exposed from the first insulating protective layer.

2. The substrate of claim 1, wherein the metal bumps are solder pads serving electrical connections for a flip-chip package.

3. The substrate of claim 1, wherein the metal bumps are a heat sink and wire bonding pads surrounding the heat sink serving electrical connections for a wire bonding package.

4. The substrate of claim 1, further comprising a metal support frame disposed on the first assistant dielectric layer.

* * * * *